United States Patent

[11] 3,579,811

[72] Inventors Masao Matsuo
Takarazuka-shi;
Hiroshi Tomiwa, Osaka, Japan
[21] Appl. No. 884,226
[22] Filed Dec. 11, 1969
[45] Patented May 25, 1971
[73] Assignee Matsuo Electric Company, Limited
Toyonaka-shi, Osaku-fu, Japan
[32] Priority Dec. 21, 1968
[33] Japan
[31] 43/93890

[54] METHOD OF MAKING PASSIVE ELECTRONIC COMPONENTS INCLUDING LAMINATING TERMINALS TO SUBSTRATE
3 Claims, 17 Drawing Figs.

[52] U.S. Cl. .......... 29/570, 29/25.41, 317/230
[51] Int. Cl. .......... H01g 13/00
[50] Field of Search .......... 317/230, 231, 232, 233; 29/569, 570, 576, 25.41, 625, 626

[56] References Cited
UNITED STATES PATENTS
3,345,544 10/1967 Metcalf .......... 317/230
3,349,294 10/1967 Heinimann et al. .......... 317/230
3,403,303 9/1968 Klein .......... 317/230
3,465,426 9/1969 Baier et al. .......... 29/570
3,516,150 6/1970 Leech .......... 29/570

*Primary Examiner*—James D. Kallam
*Attorney*—Eugene E. Geoffrey, Jr.

ABSTRACT: A method of making a chip-shaped electronic component by forming a laminated structure consisting of a metal plate and a substrate adhesively secured to one side thereof. Etching the metal plate to form a plurality of raised terminals and then forming a plurality of elongated conductive members having electronic elements formed on the outer ends thereof, which elements are then electrically and mechanically secured to selected terminals while adjoining portions of said conductive members are secured to other terminals of each set. Enclosing the formed structure within a molded resin and then stripping the substrate to expose one surface of the sets of terminals. Thereafter the structure is cut to separate the components one from the others. An improved electronic component is provided having the terminals on one face thereof which thereby facilitates attachment to a printed circuit board or other electronic circuit structure.

INVENTORS
MASAO MATSUO
HIROSHI TOMIWA
BY
ATTORNEY

INVENTORS
MASAO MATSUO
HIROSHI TOMIWA

BY [signature]

ATTORNEY

INVENTORS
MASAO MATSUO
HIROSHI TOMIWA
BY
ATTORNEY

METHOD OF MAKING PASSIVE ELECTRONIC COMPONENTS INCLUDING LAMINATING TERMINALS TO SUBSTRATE

This invention relates to chip-shaped passive electronic components which may be face bonded to an electric circuit such as a printed circuit, and to a method of manufacturing such components. The chip-shaped electronic components in accordance with this invention may be manufactured in groups and which greatly facilitates the manufacturing process.

Chip-shaped passive electronic components for use in modern electronic circuits are required to be as small as possible. However, known prior art structures utilize external lead conductors which must be precisely formed in order to facilitate attachment to a hybrid printed circuit board. This constitutes one of the disadvantages encountered in the manufacture of such printed circuits. Furthermore, a number of additional manufacturing steps are required for manufacture of the components with the result that mass production is exceedingly difficult because of manual operations required as well as the special jigs. Thus a substantial cost of the component is occasioned by reason of the relatively complicated manufacturing process.

One object of this invention resides in the provision of a novel and improved method for manufacturing passive electronic components wherein a large number of components can be assembled and encapsulated concurrently and at the same time maintain uniform quality and relatively low cost.

Another object of this invention resides in the provision of an improved electronic component wherein two or more terminals of the components lie on one face thereof and wherein a plurality of such components can be manufactured and embedded in a resin simultaneously at a relatively high speed.

A further object of the invention resides in the provision of a novel and improved component readily adapted for use in face bonding processes and which does not require external lead conductors with the result that the cost entailed in attaching the component to a printed circuit board is materially reduced.

According to the invention a metal plate is provided with an adhesive substrate adhered to one side thereof whereupon the other side of the metal plate is selectively etched to form an array of a plurality of sets of terminals. A plurality of elongated conductive members held in fixed spaced relationship is formed from a thin metal plate by stamping or other suitable process. The electronic elements are then formed on said conductive members which are then aligned with the terminals of each set so that the electronic elements can be adhered to selected terminals of said sets. The unnecessary portions of said conductive members are then removed and the remaining structure is embedded in a synthetic resin. The substrate is then stripped from said one side of the metal plate exposing the individual terminals and then the resin is cut in order to separate the sets of terminals and form a plurality of individual components.

More specifically and in accordance with the invention, the elongated conductive members may be in the form of a comblike metal structure with the members being disposed in substantially parallel relationship. Each member serves to contact the electronic element and at the same time act as a bridge member for electrically connecting the element to an adjoining terminal. In this way a plurality of electronic components can be assembled continuously and simultaneously.

The adhesive substrate secured to one side of the metal plate may take any suitable form though it is preferable to utilize a resilient material and secure such material to the plate by a double-sided adhesive tape or by applying a coating of adhesive to the resilient material. Through the utilization of a conventional masking technique the metal plate is selectively etched to form a plurality of sets of terminals each including two or more discrete terminals which are held in position by the adhesive surface of the substrate.

The comblike structure is then placed on the terminals so that the electronic elements and the conductive members are accurately aligned with the terminals. Bonding of the electronic elements and the conductive members to the terminals may be effected by soldering or welding. Upon removal of the unnecessary portions of the comblike structure, the resultant assembly is then enclosed in a synthetic resin through the utilization of a suitable metal mold. The adhesive substrate is then removed to expose the terminals and the terminals may then be plated with a soldering material. The resin layer is then cut to separate the individual components.

The above and other objects and advantages of the invention will become more apparent from the following description and accompanying drawings forming part of this application.

Figure 4A:
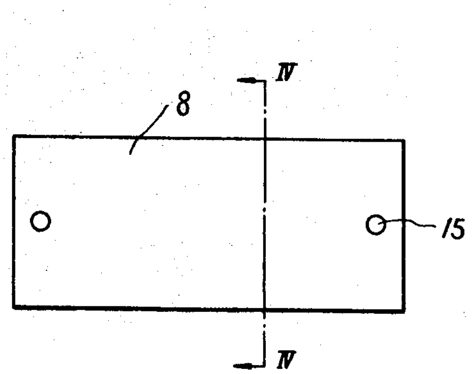
Figure 4B:
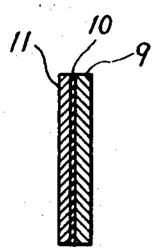
Figure 5A:
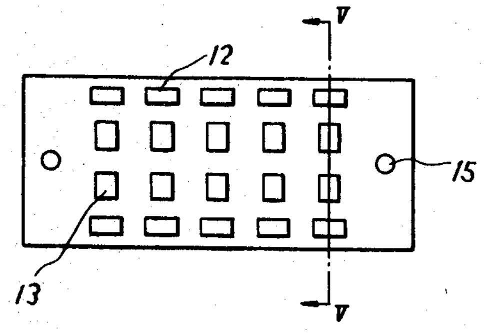

FIG. 4*a* is a plan view of a laminated metal plate in accordance with the invention;

FIG. 4*b* is a cross-sectional view of FIG. 4*a* taken along the line IV–IV thereof;

FIG. 5*a* is a plan view of the discrete terminals formed from the metal plate of FIG. 4*a;*

Figure 3:
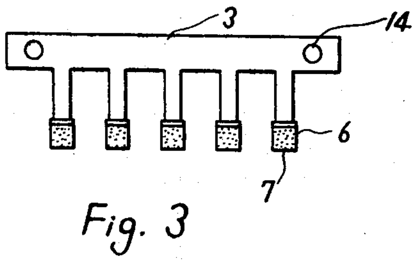
FIG. 3 is a plan view of the structure shown in FIG. 2 with electronic elements formed thereon.
Figure 5B:
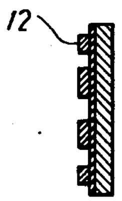
Figure 6A:
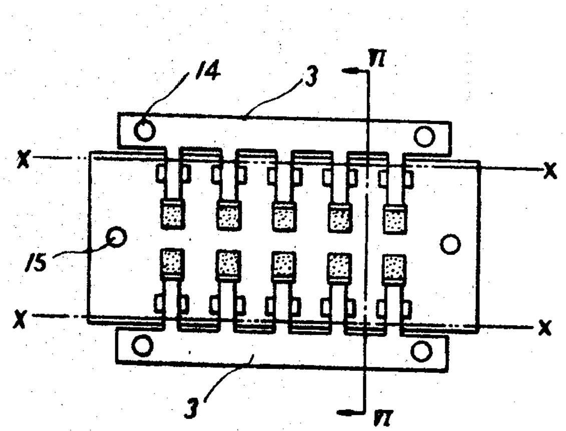
Figure 6B:
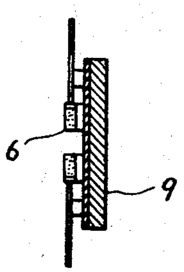
Figure 7A:
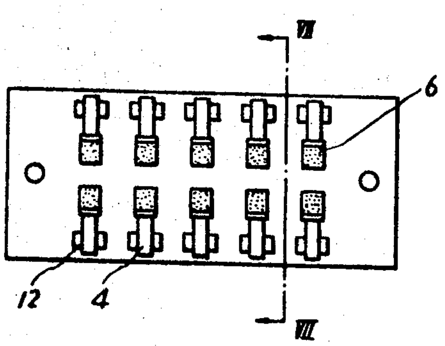

FIG. 5*b* is a cross-sectional view of FIG. 5*a* taken along the line V–V thereof;

FIG. 6*a* is a plan view of the terminal array of FIG. 5*a* with two comblike structures as shown in FIG. 3 positioned thereon;

FIG. 6*b* is a cross-sectional view of FIG. 6*a* taken along the line VI–VI thereof;

FIG. 7*a* is a plane view similar to that of FIG. 6*a* wherein a portion of each comblike structure has been removed along the lines X–X and X–X of FIG. 6*a;*

Figure 1:
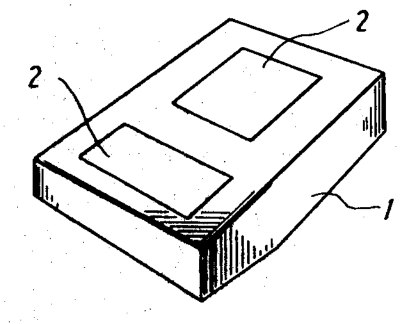
FIG. 1 is an enlarged perspective view of a tantalum electrolytic capacitor in accordance with the invention.
Figure 7B:
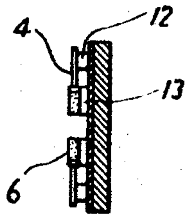
Figure 8A:
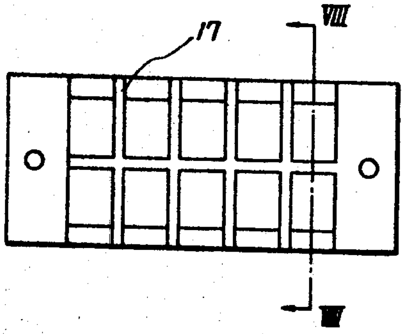
Figure 8B:
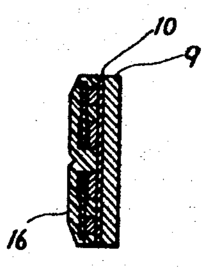
Figure 9A:
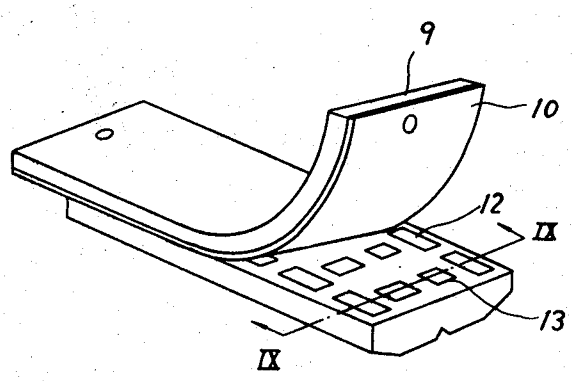
Figure 9B:
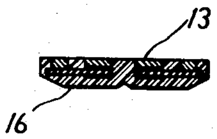
Figure 10:
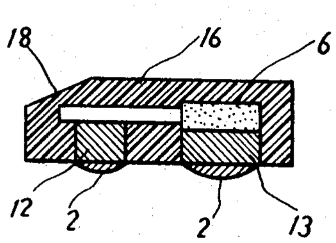
Figure 11:
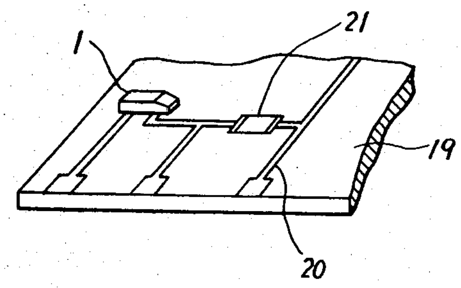

FIG. 7*b* is a cross-sectional view of FIG. 7*a* taken along the line VII–VII thereof;

FIG. 8*a* is a plan view of the structure shown in FIG. 7*a* embedded in a synthetic resin;

FIG. 8*b* is a cross-sectional view of FIG. 8*a* taken along the line VIII–VIII thereof;

FIG. 9*a* is a bottom view of the structure shown in FIG. 8*a* with a portion of the substrate being stripped from the structure;

FIG. 9*b* is a cross-sectional view of FIG. 9*a* taken along the line IX–IX thereof;

FIG. 10 is an enlarged cross-sectional view of a completed component such as that illustrated in FIG. 1; and FIG. 11 is a perspective view of a hybrid printed circuit board with an electronic component in accordance with the invention in position thereon.

In the drawings like reference numerals have been used to denote corresponding elements in each of the FIGS.

Referring now to FIG. 1, the numeral 1 denotes a tantalum electrolytic capacitor in accordance with the invention having a pair of terminal pads 2,2. As will become apparent from the following description, this invention is not limited to the manufacture of capacitors but may be utilized for the manufacture of other types of components.

Figure 2:
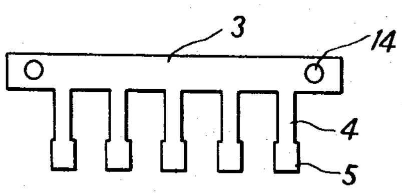
FIG. 2 is a plan view of a comblike structure utilized in the manufacture of the components in accordance with the invention.

In the improved method of manufacturing electronic components in accordance with the invention, a comblike structure as illustrated in FIG. 2 is formed from a thin metal sheet by punching or other suitable process. Such metals as tantalum, niobium, titanium or aluminum may be used. The resultant structure includes a bridge member 3, a plurality of elongated conductive members 4 and slightly enlarged electronic element holder portions 5 on the ends thereof. While only five conductive members 4 have been illustrated in FIG. 2, such structure may include many times that number. The bridge member 3 is also provided with two holes 14 which serve as guides for accurately positioning the structure with reference to an array of terminals, the formation of which will hereinafter be described.

In the manufacture of a tantalum capacitor an anode body consisting of sintered tantalum powder is bonded by welding to each element holder 5 and an anodic oxidation layer, a manganese dioxide layer and a carbon and silver cathode layer are successively formed to complete the capacitor elements 6 as shown in FIG. 3. While tantalum powder is used as the anode body in the present embodiment of the invention, powder of other film-forming metals such as aluminum or niobium may be used or wires or plates of such metals which are suitably worked may also be used. In FIG. 3, the numeral 7 denotes a terminal portion of an element 6.

Referring now to FIGS. 4*a* and 4*b*, a plurality of sets of terminals is formed by preparing a laminate 8 consisting of a metal plate 11 having a substrate 9 adhered to one side thereof by an adhesive or thermobonding tape 10. The metal plate may be formed of nickel, Kovar (trade name), iron or copper which may be either welded or soldered. The adhesive layer or tape as the case may be should preferably be heat resistant and etch resistant so that it will not be affected by the etching solution normally used in chemical etching and which can be readily stripped after the resin molding process for encasing the electronic components has been completed. Formation of the laminate may be prepared by utilizing a double-sided coated tape sold by the Du Pont Company under the trademark Capton which is a thermobonding tape.

The metal plate 11 is then photoetched utilizing a conventional masking and chemical etching technique to form a plurality of sets of discrete terminals 12 and 13 thus producing a terminal array as shown in FIGS. 5*a* and 5*b*. The terminals 12 and 13 are held in position by the adhesive 10 and the substrate 9 and have areas suitable for bonding the capacitor elements and are spaced to facilitate separation of the completed components after the resin molding process. One or more of the terminals of each set may be plated with gold, silver, solder or the like to facilitate attachment of the capacitor element.

Referring now to FIGS. 6*a* and 6*b*, the comblike structures shown in FIG. 3 are placed on the terminal array, as illustrated in FIGS. 5*a* and 5*b*. A paste solder may be applied to one terminal 13 of each set which serves as the cathode terminal of the capacitor, and the capacitor element is accurately positioned with reference to that terminal. If each terminal is previously plated with solder, the past solder can be omitted. The other terminal 12 of each set is aligned with an adjoining portion of each conducting member 4 and may be bonded thereto by welding. Since the members 4 of the comblike structure are maintained in alignment by the bridge member 3, the capacitor elements 6 are held in precise alignment and positioning can be accurately attained by utilizing the sets of guide holes 14 and 15 of the bridge member 3 and the substrate 9 in combination with a suitable jig.

Upon completion of the bonding process the bridge member 3 and the unnecessary portions of the conductive members 4 are removed by cutting along the lines X–X of FIG. 6*a* to obtain the structure shown in FIGS. 7*a* and 7*b*. The terminal portions 7 of the elements 6 may be soldered to the terminals 13 by heating with infrared radiation or through the utilization of an electronic furnace. If necessary, the finished assembly may be washed to remove flux.

The assembly including the capacitor elements 6 is then placed in a metal mold in order to mold a resin on the side of the structure to which the elements 6 are attached. The molded structure will be observed more clearly in FIGS. 8*a* and 8*b* wherein the resin is denoted by the numeral 16.

Upon completion of the molding process, the substrate 9 and the adhesive tape 10 are stripped from the molded terminal array as shown in FIG. 9*a* to expose the terminals which serve as the electrodes of the capacitors. It will be observed that the exposed surface of the terminals are free of resin. If the thickness of the plate 11 from which the terminals are formed is properly selected, firm support of the terminals is provided by the resin 16 so that a sturdy and durable structure is obtained. The final molded structure may be observed more clearly in FIG. 9*b*.

The exposed terminal surfaces are then plated with solder and after marking, aging, and inspection, the molded structure is then cut along horizontal and vertical lines 17 as shown in FIG. 8*a* to separate the individual capacitors as illustrated in FIGS. 1 and 10.

In FIG. 10 the numeral 2 denotes a solder pad on each of the exposed terminals while the numeral 18 denotes a cutaway portion for indicating the anode side of the capacitor. This cutaway portion is formed during the resin-molding process.

FIG. 11 illustrates a hybrid printed circuit board 19 having printed conductors 20, a plated resistor 21, and a capacitor 1 in accordance with the invention secured to two of the conductors 20.

As is evident from the foregoing description, a relatively large number of chip-shaped passive electronic components can be formed simultaneously and therefore the manufacturing and molding processes can be greatly facilitated. Moreover, by the improved structural arrangement of the electronic components in accordance with this invention, attachment of the components to conductors on a printed circuit board can be effected quickly and easily since a number of such components can be simultaneously bonded by the use of a face-bonding technique. This technique merely involves the placement of a plurality of components on one face of the printed board with the pads 2 in engagement with the appropriate conductors and then utilizing supersonic oscillation or a heating furnace to electrically bond the components to the conductors. Thus both the manufacturing coasts as well as the cost of securing the component to a printed circuit board is reduced.

While the foregoing embodiment of this invention has been described in connection with the manufacture of a tantalum solid electrolytic capacitor, it is evident that the invention is equally applicable to other types of capacitors and electronic components including inductors. Furthermore, the invention is applicable to more complicated electronic components having three or more terminals by merely increasing the number of terminals in each set.

Moreover, while an adhesive tape is preferred, it is possible to utilize a layer of a suitable material applied to the substrate 9.

We claim:

1. The method of manufacturing resin molded chip-shaped electronic components comprising the steps of adhering a supporting substrate to one side of a metal plate, selectively etching the other side of said metal plate to form a plurality of sets of terminals, forming a plurality of elongated conductive members in fixed spaced parallel relationship and coordinated with said sets of terminals, electrically connecting electronic elements to said elongated conductive members, electrically connecting said elements and portions of said members to corresponding sets of terminals, severing said elongated members at points adjoining said sets of terminals, molding a resin about said electronic elements, the remaining portions of said members and said sets of terminals, stripping said substrate from said molded resin and terminals to expose said terminals and then severing said resin to separate said sets of terminals one from the other.

2. A method of manufacturing resin-molded chip-shaped electronic components according to claim 1 wherein said substrate is affixed to said metal plate by double-sided adhesive tape.

3. A method of manufacturing resin-molded chip-shaped electronic components according to claim 1 wherein said substrate is adhered to said metal plate by a layer of adhesive.